United States Patent [19]
Noakes et al.

[11] Patent Number: 5,684,666
[45] Date of Patent: Nov. 4, 1997

[54] PHOTOELECTRIC SWITCH

[75] Inventors: Timothy James Noakes, Near Mold; Michael Leslie Green, Nannerch; Andrew Jefferies, Near Mold; Maurice Joseph Prendergast, Runcorn, all of United Kingdom

[73] Assignee: Imperial Chemical Industries PLC, United Kingdom

[21] Appl. No.: 436,377

[22] PCT Filed: Nov. 23, 1993

[86] PCT No.: PCT/GB93/02403

§ 371 Date: May 22, 1995

§ 102(e) Date: May 22, 1995

[87] PCT Pub. No.: WO94/13063

PCT Pub. Date: Jun. 9, 1994

[30] Foreign Application Priority Data

Nov. 25, 1992 [GB] United Kingdom ............ 9224651

[51] Int. Cl.⁶ ............................ H03K 17/78; H05F 3/02
[52] U.S. Cl. ............................ 361/228; 361/235
[58] Field of Search ............................ 307/117, 107; 239/3, 690, 691, 706, 707, 708; 361/215, 220, 225–228, 235

[56] References Cited

U.S. PATENT DOCUMENTS

| | | | |
|---|---|---|---|
| 4,011,991 | 3/1977 | Masuda | 361/227 |
| 4,225,090 | 9/1980 | Kako et al. | 361/227 |
| 4,228,961 | 10/1980 | Itoh | 361/226 |
| 4,240,088 | 12/1980 | Myers | 357/19 |
| 4,289,278 | 9/1981 | Itoh | 361/227 |
| 4,740,799 | 4/1988 | Mason et al. | |
| 4,858,061 | 8/1989 | Hethcoat | 361/215 |
| 5,093,625 | 3/1992 | Lunzer | 361/228 |
| 5,184,778 | 2/1993 | Noakes | 239/691 |
| 5,222,663 | 6/1993 | Noakes et al. | 239/3 |
| 5,222,664 | 6/1993 | Noakes et al. | 239/3 |

*Primary Examiner*—Fritz Fleming

[57] ABSTRACT

A novel semiconductor switching device for use in high voltage applications (typically ranging from 5 kV up to about 50 kV) makes use of the well-known effect of reverse conduction in silicon diodes when exposed to light. Hitherto, photodiodes have been commercial available for relatively low voltage applications. The device disclosed herein is implemented by a high voltage diode having a series of semiconductor junctions and a light emitting diode operable to irradiate the junctions to render the high voltage diode conducting in the reverse bias direction. The switching device finds application in electrostatic spraying devices where the current demands are relatively small, eg up to about 2 μA.

17 Claims, 3 Drawing Sheets

PHOTOELECTRIC SWITCH

This invention relates to electronic switching means for use in applications involving high voltages of at least 1 kV and more usually at least 5 kV ranging up to 50 kV.

Although not limited thereto, the invention has particular application to devices for affecting electrostatic spraying of materials, especially liquids. Typical devices of the type that the present invention is concerned with are disclosed in EP-A-120633, EP-A-441501, EP-A-468735 and EP-A-468736.

According to one aspect of the present invention there is provided electronic switching means comprising a series of radiation sensitive semiconductor junctions collectively having a maximum dc reverse voltage of at least 1 kV (preferably at least 5 kV and often at least 10 kV), terminal means for the application of high voltage to the junctions such that the junctions permit current flow in one direction only when forwardly biased by an applied voltage, and selectively operable, radiation producing means associated with said junctions for selectively irradiating the same so as to produce current flow in the reverse direction when the junctions are reverse biased by an applied voltage, said junctions and the radiation producing means being supported in fixed predetermined relation within a mass of encapsulating material transmissive to the radiation emitted from the radiation producing means.

Preferably said junctions collectively have a maximum dc reverse voltage of at least 5 kV and more preferably at least 10 kV.

It is to be understood that, when said series of junctions are reverse biased and not exposed to radiation from said radiation producing means, there may nevertheless be a small current flow as in the case of a conventional diode (dark current) but the reverse current flow is neglible compared with that produced when the junctions are forwardly biased with a voltage of the same amplitude but opposite polarity. In contrast, when the junctions are reverse biased and subjected to irradiation, the current flow is substantially greater than that occurring in the absence of such irradiation.

The encapsulating mass may be such as to provide reflective surfaces in the vicinity of the junctions so that radiation which is not directly incident on the junctions is reflected thereby increasing the efficiency with which the Junctions is irradiated. Such reflective surfaces may be constituted by a specific layer or layers of material reflective to radiation at the wavelength or wavelengths emitted by the radiation producing means; or reflectivity may be obtained as a result of changes in refractive index within the mass of encapsulating material.

It is widely known that silicon diodes having a pn junction are photosensitive and that, when reverse biased and exposed to near infrared radiation, such diodes are rendered conductive and permit current flow substantially in excess of the dark current. This is the principle underlying photodiode operation. In contrast with conventional photodiodes which have an architecture or layout consistent with making effective use of incident light, the switching means according to said one aspect of the invention is designed to operate at voltages substantially in excess of those at which conventional photodiodes are intended to operate. Thus, conventional photodiodes are designed with maximum dc reverse voltages ranging up to 600 volts (see "Optoelectronics", D.A.T.A. Digest 1992 (Edition 25) published by D.A.T.A. Business Publishing of Englewood, Colo., USA—"Photodiodes", Page 613) whereas the switching means of this aspect of the invention is intended for use in applications involving high voltages of at least 1 kV, and more usually at least 5 kV ranging up to for example 50 kV.

In a preferred embodiment of the invention, said series of semiconductor junctions constitute a high voltage semiconductor diode, preferably a high voltage silicon diode having a series of stacked pn junctions.

The radiation producing means conveniently comprises a light-emitting diode. As used herein, references to "light" are to be understood to encompass electromagnetic wavelengths lying outside the visible part of the spectrum as well as wavelengths within the visible spectrum. For instance, a suitable form of light-emitting diode produces an output in the near infrared and the high voltage diode forming said series of junctions may be sensitive to such radiation.

Although the components forming the switching means of the present invention may be fabricated in the form of a large scale integrated circuit, the invention includes within its ambit fabrication of the switching means from discrete components.

Accordingly, a second aspect of the present invention provides a method of fabricating electronic switching means as defined hereinabove, in which a high voltage semiconductor diode and a solid state light-emitting source are assembled in predetermined relation such than the series of junctions of the diode are exposed to light emitted by said source, and encapsulating the so related diode and source in an encapsulant material which is transmissive to the light emitted by the source.

The predetermined relation will usually involve positioning of the source in close proximity with the diode junctions in such a way that a substantial part of the light emitted by the source will be incident on the diode junctions.

This aspect of the invention may be implemented using commercially available discrete components. Commercially available high voltage diodes have an architecture or layout, ie. a series of stacked pn junctions (typically in excess of ten such junctions and often twenty or more) appropriate for management of high potential and are fabricated without retard to light-induced effects using encapsulant materials which are not particularly suited to permitting exposure of the junctions to external radiation; indeed, this is generally considered highly undesirable.

Thus, in accordance with this aspect of the invention, the diode may comprise a conventional commercially available high voltage diode encapsulated in an electrically insulating material, in which case the diode selected may be one having an encapsulating material which already has substantial transmissivity with respect to the wavelength of the light emitted by the source or alternatively the source may be selected so as to be compatible with the diode encapsulating material in terms of transmissivity of the latter with respect to the wavelength of light emitted by the source.

Where the commercially available diode is one having an encapsulating material which is opaque or has relatively low transmissivity with respect to the light emitted by the source, the method of the invention comprises modifying the diode encapsulating material to impart, or enhance, effective light coupling between the source and the series of junctions of the diode.

Such modification may involve at least partial removal of the diode encapsulating material or some form of treatment to enhance the light transmissivity of the encapsulating material. For instance, one form of high voltage diode in widespread use is encapsulated in a glass material, the transmissivity of which can be modified by heat treatment.

According to a further aspect of the invention there is provided a high voltage generating circuitry producing an output voltage of at least 1 kV, more usually at least 5 kV, at output terminal means thereof, said circuitry incorporating an electronic switching means as defined hereinabove operatively associated with the output terminal means.

This aspect of the invention has particular application to high voltage generating circuitry adapted to be powered by a low voltage source such as a battery supply.

In one embodiment thereof, the circuitry is arranged to produce a unipolar high voltage output and the electronic switching means is coupled to the output terminal means in such a way that said series of junctions are reverse biased by said unipolar output voltage.

In another embodiment thereof, the circuitry is operable to produce an alternating high voltage output, said switching means being coupled in the circuitry in such a way as to rectify said alternating output voltage to produce at the output terminal means a high voltage of one polarity, the arrangement being such that said series of junctions is reverse biased by the opposite going polarity cycles of the alternating output voltage.

In a further embodiment, the circuitry is operable to produce an alternating high voltage output and a pair of said switching means is associated with the output terminal means, each switching means being arranged such that one switching means is reverse biased and the other forward biased by the positively going cycle of the alternating voltage and vice versa by the negatively going cycle, means being provided for controlling operation of the radiation producing means of each switching means to render each switching means conductive in reverse biased condition thereof. The switching means in such an embodiment may be in series or in parallel with each other.

In yet another embodiment, the circuitry comprises a pair of output terminal means at each of which a unipolar output is produced, the output at one terminal means being of opposite polarity to that produced at the other terminal means, and a pair of said switching means associated with said output terminal means and connecting each output terminal means to a common terminal means but being reverse biased by the respective unipolar output, means being provided for controlling the radiation producing sources of the switching means in such a way that the switching means are alternately rendered conductive whereby a bipolar output is produced at said common terminal means.

Although the present invention in its broader aspects is not limited thereto, electronic switching means/high voltage generating circuitry as defined above is particularly applicable to relatively low current consumption devices in which the maximum reverse current conducted by the series of junctions is preferably no greater than 10 µA, and more preferably no greater than 2 µA.

According to another aspect of the present invention there is provided an electrostatic spraying device comprising a housing, nozzle means, means for supplying to the nozzle means a material to be sprayed from the nozzle and high voltage generating circuitry for directly or indirectly applying to the material high potential whereby the sprayed material is electrostatically charged, said circuitry including electronic switching means as defined hereinabove associated with the high voltage output of the circuitry and arranged to control current and/or voltage switching operations of the device.

The electronic switching means of the invention is particularly suitable for electrostatic spraying devices of this type especially where current consumption is low (typically no greater than 10 µA, and more usually no greater than 2 µA) and where factors such as compactness and cheapness are at a premium. Conventional photodiodes are totally unsuitable since they are only capable of use at low voltages and are in any event conventionally only considered in applications involving signal handling as opposed to current handling applications. Most commercially available high voltage switches are geared towards high current applications (eg switchgear) and are mechanical in nature, bulky, expensive and totally unsuited for spraying devices of the type just referred to. Reed relays are widely available for low current switching applications but are relatively expensive being electromechanical in nature with high input requirements and short lifetimes and have upper limiting voltages of the order of 12 kV. Any mechanically based switching device is subject to size constraints due to the need for separation of components at elevated voltages.

In one embodiment of the spraying device, the switching means is operable to provide a current discharge path in response to de-energisation of the high voltage generating circuitry. In this instance, the switching means may be reverse biased by the high voltage during spraying operation of the device, and the arrangement may be such that, in response to de-energisation of the circuitry, the radiation producing means is operated to irradiate the switching means and thereby render the latter conducting so as to provide a path for discharge of current from any capacitively stored electrical charge at the high voltage output side of the circuitry. The capacitive component may be constituted by capacitance associated with the high voltage circuitry and/or capacitance associated with the load to which the output voltage of the circuitry, eg. a metal can containing liquid, such as paint, to be sprayed.

The switching means, when used in this manner, obviates the need for a resistive element at the output side of the circuitry for the purpose of discharging any capacitively stored charge which, if not discharged at the time of de-energisation of the high voltage circuitry, gives rise to a risk of electric shock being experienced by the user. The use of such a resistive element constitutes a current drain during spraying and the high voltage circuitry must therefore be designed to take such current drain into account, with the consequence that the circuitry necessarily has to produce a current output in excess of that strictly required for spraying purposes.

In the interests of compactness and cheapness, it is desirable to avoid current drain of this nature. This is particularly the case for hand held or readily portable self-contained spraying devices of the type intended to be powered by a low voltage battery supply, for example hand held devices for spraying of personal care and hygiene compositions such as fragrances, deodorants and the like, or hand held devices for spraying of paint compositions, or portable free standing devices for spraying room freshener and aromatic compositions. Where a low voltage battery supply is employed, unnecessary power consumption should obviously be eliminated as far as possible in order to prolong battery life. Also, for reasons of economy, the output requirements of the high voltage circuitry design will desirably be minimised to permit the use of inexpensive circuit designs. The switching means of the invention is particularly suitable where the above constraints apply because the current drain is limited to the dark current component (which is negligible in practice) and, when the high voltage circuitry is disabled, the switching means may be rendered conductive in the reverse bias direction to effect discharge of stored charge.

In this embodiment of the invention, the switching means may be rendered conductive automatically in response to operation of a user-actuable switch for de-energising the high voltage circuitry and discontinuing spraying. Thus, the device conveniently includes user-actuable means for selectively energising and de-energising the high voltage circuitry and control means for triggering emission of radiation by the radiation producing means to render the switching means conductive in response to operation of the user-actuable means to effect de-energisation of the high voltage circuitry.

Conveniently the switching means may, when arranged to afford a path for discharge of capacitively stored charge, be coupled into the high voltage circuitry in such a way as to provide rectification. For instance, in this event, the high voltage circuitry may include a step-up transformer with one side of the secondary thereof tapped to provide an alternating high voltage output and the other side of the secondary connected to a low potential such as earth, and the switching means may be connected in series with the secondary to rectify the alternating voltage and thereby produce a unipolar high voltage output which may be subjected to capacitive smoothing to remove or at least substantially attenuate high voltage peaks. In such an arrangement, when the circuitry is de-energised, charge stored by the capacitive smoothing component is discharged to said low potential (eg earth) by rendering the switching means conductive in the reverse bias direction and the switching means my be placed in this condition automatically in response to de-energisation of the high voltage circuitry.

According to yet another aspect of the present invention there is provided an electrostatic spraying device comprising a housing, nozzle means, means for supplying to the nozzle means material to be sprayed, high voltage generating circuitry having an output terminal via which high voltage is applied to said material to effect electrostatic spraying thereof, an annular element encircling the nozzle means and on which a high voltage of the same polarity as that applied to said material is established during spraying to modify the field intensity in the immediate vicinity of the nozzle outlet, and means operable upon cessation of spraying to discharge electrical charge stored by capacitive elements of the device during spraying.

This aspect of the invention has particular application to the spraying of liquids which have relatively high viscosity and low resistivity, may contain suspended solids, eg paint formulations, and tend to be difficult to spray satisfactorily at flow rates up to at least 4 cc/min using previously developed technology. Typically, the liquid to be sprayed has a viscosity of at least 0.5 Poise, eg 0.5 to 10 Poise and a resistivity between $5 \times 10^5$ and $5 \times 10^7$ ohm.cm.

Said discharge means preferably comprises a switching means as referred to hereinbefore and the voltage generating circuitry is operable to produce an output voltage of at least 25 kV. Voltages of this magnitude are necessary when the liquid to be sprayed is relatively viscous and/or where there is a requirement for a wide range of flow rates: such voltages are normally considered to be in excess of those that can be employed without giving rise to spurious spraying effects believed to be attributable at least in part to corona discharge effects. Also, operation with voltages of this magnitude lead to capacitive storage of large amounts of electrical charge giving rise to the possibility of the user receiving an unpleasant shock in certain circumstances. The combination of features forming this last mentioned aspect of the invention allows large voltages to be used whilst securing satisfactory spraying of relatively viscous, low resistivity liquids such as paint formulations and affording the user protection against discharge of capacitively stored charge.

Usually an electrostatic spraying device as referred to in any of said aspects of the invention will be powered by a low voltage source, such as a battery pack, connected to the input side of the high voltage generating circuitry and the device will often be in the form of a portable self-contained unit which my be adapted to be held in the hand.

It will be understood that the electrostatic spraying devices disclosed herein are suitable for the spraying of a wide variety of materials, eg. personal care or hygiene compositions, aromatic compositions suitable as air fresheners, paint formulations, insecticides, bactericides and medical preparations. The invention accordingly includes within its ambit electrostatic spraying devices as disclosed herein when fitted with a cartridge containing any one of these materials.

Various other features and aspects of the invention will become apparent from the appended claims and the following description, by way of example only, of various embodiments of the invention illustrated in the accompanying drawings.

Figure 1:
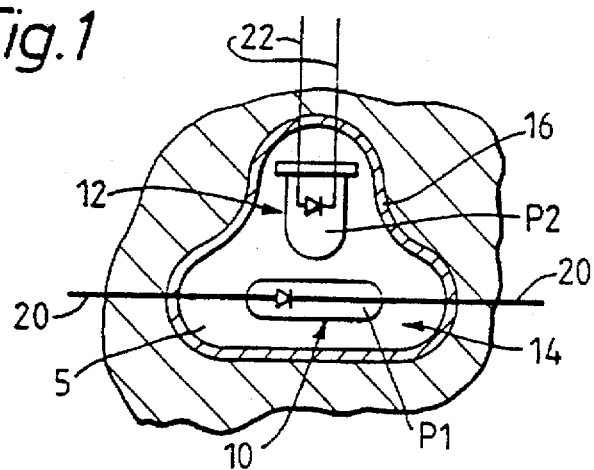
FIG. 1 is a schematic view showing one embodiment of a light sensitive high voltage electronic switching means in accordance with the invention.

Referring to FIG. 1, a switching element in accordance with the invention comprises an extra high tension diode 10 which may typically be constituted by a Philips EHT diode, Part No. BY713(available from RS Components Limited, Part No. RS 262-781). This diode is a silicon diode comprising a series of stacked pn junctions encapsulated in a mass of encapsulating material P1 (herein called the primary encapsulant) and designed for use in high voltage applications, the maximum dc reverse voltage of the diode being 24 kV. A light source in the form of a light-emitting diode (LED) 12 also encapsulated in a mass of encapsulating material P2 (primary encapsulant, but not necessarily the same material as the material P1) is mounted in close proximity with the EHT diode 10 so that the light emitted by the LED 12 when energised is incident on the EHT diode 10. Typically the LED 12 is constituted by a high powered infrared emitting LED such as that available from RS Components Limited, Part No. RS635-296. Both the EHT diode 10 and the LED 12 are encapsulated as supplied. Where the switching element of the present invention is fabricated from discrete components as in the case of FIG. 1, selection of an EHT diode with an encapsulant having at least some degree of transmissivity with respect to the wavelength of light produced by the LED is advantageous. Thus, we have found the above combination of components advantageous since the Philips BY713 EHT diode as supplied has a glass encapsulant which is transmissive with respect to the wavelength of IR produced by a RS635-296 LED.

During fabrication, the EHT diode 10 and LED 12 are assembled in optically aligned relationship to ensure that the IR emitted by the LED 12 is fully effective in irradiating the pn junctions of the diode 10, taking into account the fact that the architecture of the diode 10 is aimed at high voltage management rather than light collection (as in the case of a photodiode). The EHT diode 10 and LED 12, once suitably aligned, are then encapsulated in a mass 14 of material (secondary encapsulant S) having appropriate transmissivity with respect to the wavelength of emission of the LED. The encapsulating mass 14 is moulded around the diode 10 and LED 12 in such a way as to avoid the development of air gaps at the respective interfaces and which would tend to act as reflective boundaries. This can be readily achieved by adopting a moulding technique which ensures that any shrinkage that occurs during curing of the encapsulating material takes place at the outer peripheral surface of the mass 14 rather than at the interfaces with the diode 10 and LED 12. To avoid deleterious boundary effects, the encapsulating material forming the mass 14 is selected so as to provide at least reasonable refractive index matching with the encapsulating materials of the diode 10 and LED 12. In the case of the specified components (the BY713 diode and RS635-296 LED), suitable encapsulating materials are the light curing resin LUXTRAK LCR 000 (LUXTKAK is a RTM of Imperial Chemical Industries Group of companies) and the UV curing resin RS505-202 available from RS Components. The secondary encapsulant S additionally serves to provide a high degree of electrical insulation between the diode 12 at low voltage and the HT diode 10 at high voltage.

As indicated above, it is important that the moulding procedure for encapsulating the diodes 10 and 12 in the secondary encapsulant S is conducted in such a way as to ensure that the radiation emitted by diode 12 is used efficiently. In particular, care must be taken prevent the formation of interlayer voidages between the primary and secondary encapsulants. Such voidages tend to arise as a result of internal stresses set up as the secondary encapsulant shrinks on curing. This can be achieved by applying a release agent to the mould to prevent the secondary encapsulant adhering to the sides of the mould so that the curing secondary encapsulant preferentially adheres to the primary encapsulant during shrinking rather than to the mould surfaces. Alternatively, instead of using a release agent, the mould may be lined with a flexible film liner to prevent the secondary encapsulant adhering to the mould surfaces.

As mentioned previously, the architecture of conventional high voltage diodes is not geared to making effective use of incident light; indeed many high voltage diodes are encapsulated in material which is effective to shield the pn junctions from light exposure. In contrast, the present invention seeks to exploit the known affect that light has on pn junctions and, where the switching element of the invention is fabricated using a commercially available discrete high voltage diode, rather than shielding the diode from light exposure, it is desirable to maximise light exposure given that the architecture is not optimised for light collection. Thus, where enhancement of the light exposure is needed, in addition to locating the LED 12 in close proximity with, and in an optimal orientation relative to, the EHT diode 10, provision is made of a reflecting surface or surfaces to re-direct light which is not directly incident on the EHT diode.

In the illustrated embodiment, this is implemented by means of a layer or coating of material 16 which encompasses the EHT diode 10 and LED 12 and serves to reflect light towards the sites on the EHT diode at which light exposure is required. At least part of the layer/coating 16 is conveniently of approximately spherical contour. The layer/coating 16 may for instance be composed of MgO.

The assembly of EHT diode 10, LED 12 and encapsulating mass 14 is enclosed in a mass of potting compound 18 (tertiary encapsulant) which has good electrical insulating properties and encloses the assembly in such a way as to leave the leads 20 of EHT diode 10 and electrodes 22 of LED 12 exposed for connection to external circuitry while shielding the diode 10 from ambient light. If the tertiary encapsulant is appropriately selected, it is possible to dispense with the separate reflecting later 16; for example, the tertiary encapsulant 18 may be a white reflective material, such as that available from RS Components, Part No. RS552-668.

The shape and dimensions of the assembly are selected in such a way that suitable electrical insulation is provided between the low voltage at which the diode 12 operates and the much higher voltage at which the HT diode 10 operates. Where for instance only a secondary encapsulant is used (with or without the reflecting layer 16), the shape and dimensioning of the secondary encapsulant is selected so that the distances between the high and low voltage leads 20,22 as measured across the exposed surface of the secondary encapsulant is at least 3 mm for each kV applied to the HT diode 10. If however the assembly is encapsulated within a potting compound (for instance along with other components collectively forming an electrical circuit with the assembly comprising diodes 10 and 12), the external surface of the secondary encapsulant is not exposed to air and the shaping and dimensioning in this case is such as to allow a distance between leads 20, 22, measured across the external surface of the secondary encapsulant, of at least 1 mm for each kV to be applied to the diode 10.

In the case of a RS635-296 LED, the threshold voltage of about 1.3 V has to be exceeded to produce the light necessary to render the high voltage diode conducting in the reverse direction. The LED typically only requires 1 mA to open the switch but it is preferred, especially when used for the production of a bipolar output as described hereinafter with reference to FIG. 4, that the initial peak current to the LED should be up to about 300 mA to afford maximum current carrying capability, followed by a current supply of 5–30 mA (preferably 5–10 mA) to maintain sufficient HT output current flow for a typical application such as electrostatic spraying as described hereinafter.

Figure 2:
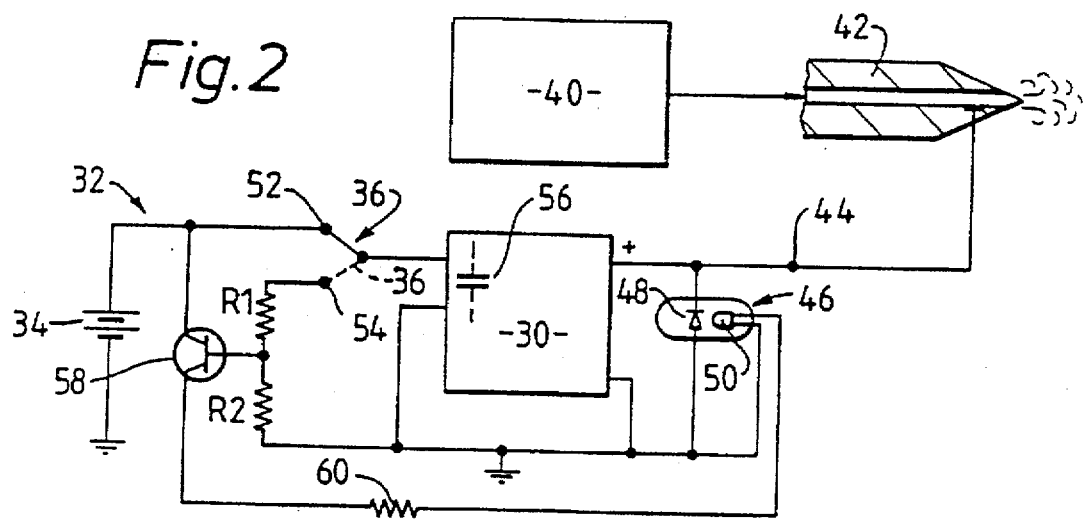
FIG. 2 is a diagrammatic view of an electrostatic spraying device incorporating high voltage generating circuitry embodying an electronic switching means of the form shown in FIG. 1.

One application of a high voltage, low current switching element, such as that described above with reference to FIG. 1, is illustrated in FIG. 2 which shows schematically the layout of the voltage producing circuitry employed in an electrostatic spraying device which may, where the context admits, take any of the forms disclosed in EP-A-120633, EP-A-441501, EP-A-468735 and EP-A-468736. As shown in FIG. 2, a high voltage generator 30 powered by a low voltage circuit 32 comprising battery pack 34 and user-actuable switch 36 with a connection to earth. The connection to earth is conveniently made through the user by providing for example a metal contact on the device which the user automatically makes contact with in holding a handgrip portion of the device. One example of such a connection is shown in EP-A-120633.

Figure 3:
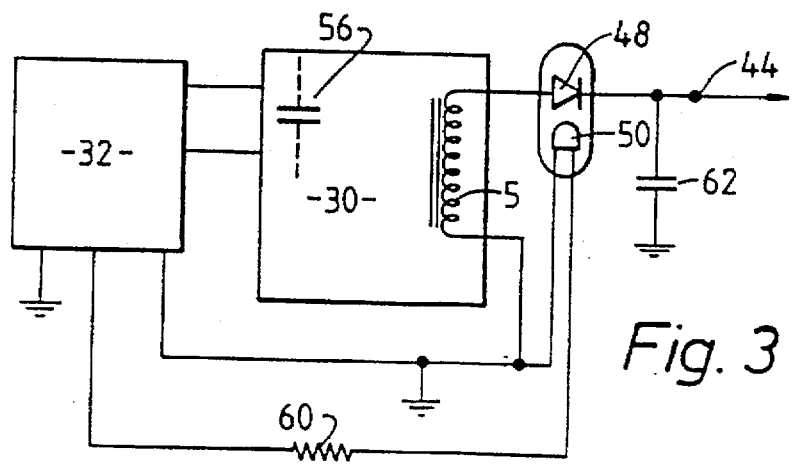
FIG. 3 is a diagrammatic view of a modified form of the embodiment shown in FIG. 2.

The handgrip portion may be equipped with a trigger which, when actuated by the user, serves to operate the switch 36 and apply pressure to a reservoir 40 containing liquid for supply to a nozzle 42 from which the liquid is electrostatically sprayed in use. Examples of suitable mechanisms for pressurising a reservoir such as a sachet are disclosed in EP-A-482814 to which reference should be for further details. The high output voltage (shown as positive in the illustrated embodiment) of the generator 30 is applied to an output terminal 44 which is connected, in use, in some suitable fashion (various possibilities are disclosed in the previously mentioned published European Patent Applications) so that the liquid emerging at the outlet of the nozzle 42 is charged. In FIG. 3, the terminal 44 is shown connected to an electrode disposed in the liquid feed path through the nozzle 42; in an alternative arrangement, the terminal 44 may for instance be electrically connected to the liquid at a location upstream of the nozzle outlet, eg the electrical connection may be made via a contact penetrating the wall of the reservoir 40 if made of insulating material or via the reservoir wall if made of conductive material. The high voltage generator 30 is preferably of the type employing an oscillator connected to the dc low voltage circuit 32 and serving to produce an alternating substantially square wave output which is fed to a step-up transformer from the secondary winding of which the high output voltage (in the form of a pulse train typically having a frequency of the order of 20 Hz) is tapped and fed to the output terminal 44 via a rectifier and capacitance circuit so as to provide a unipolar high voltage typically of the order of 10 to 30 kV as measured by connecting the high voltage output of the generator to a Brandenburg 139D high voltage meter having an internal resistance of 30 Gigohm. The capacitance provides smoothing of the pulse train and serves to eliminate very high voltage peaks in the secondary output which may approach up to about 100 kV.

The mechanism by which the spray is formed may be one in which the electrostatic field developed between the emerging liquid and a low potential (eg presented by a specific target, by the surroundings or by a low potential electrode mounted on the device in the vicinity of the nozzle) is effective to draw the liquid into one or more ligaments which then break up to produce a spray of electrically charged droplets. In this event, the feed from the reservoir 40 to the outlet of the nozzle 42 may be of a passive nature, eg under gravity or capillary feed using for example a wicking structure such as those disclosed in EP-A-120633 or EP-A-486198 or PCT Patent Application No. GB92/01712. Alternatively the mechanism may be one in which the liquid is fed under sufficient pressure to effect discharge thereof as a weak jet, the electrostatic field being effective to cause the jet to neck to a diameter substantially smiler than the orifice from which the jet issues, thereby forming a ligament which breaks to produce a spray of charged droplets. Devices of this latter type are disclosed in EP-A-501725 and are particularly suited to spraying of liquids having relatively low resistivities.

In normal use of the device, operation of the trigger by the user actuates the switch 36 to energise the generator 30 thereby charging the liquid at or in the vicinity of the nozzle 42. As discussed above, the feed of liquid to the nozzle outlet may be of a passive or forced nature; in the latter case, the pressure exerted by the user on the trigger may be translated into compression of a container (such as sachet) to force feed the liquid to the nozzle. Upon cessation of spraying, eg as a result of releasing the trigger and opening switch 36, even though the generator 30 is de-energised, there may be residual charge stored in the system, for example charge stored by capacitance associated with the load (eg any metal components such as a metal container forming the reservoir for the liquid or any metal components on the high voltage side of the generator 30). Unless appropriate expedients are employed, this stored charge poses a potential risk of electric shock for the operator; for instance if the operator, immediately on cessation of spraying, attempts to gain access to the container for the purposes of replacing the same.

In heavy duty spraying devices of the type used for industrial purposes and powered by an ac power source separate from the spraying device, a commonly used solution is to couple the high voltage output of the generator to earth through a bleed resistor so that when spraying is discontinued, the residual charge is rapidly discharged to earth via the bleed resistor. To secure rapid discharge, the value of the bleed resistor is relatively low. Thus, the power supply to the device is arranged to supply sufficient power to compensate for the continual current drain imposed by the low value bleed resistor. For industrial equipment powered by a separate ac source, this does not pose a particular problem. However, in the case of a compact and inexpensive spraying device intended for spraying consumer products (eg perfumes, personal hygiene compositions, room fragrances, paints and such like) where the power source is in the form of a dc battery supply housed within the device, it is not commercially viable to use a bleed resistor which will would otherwise bleed a significant amount of current during spraying.

As shown in FIG. 2, to provide a discharge path for residual capacitively stored charge at the time of de-energisation of the generator 30, a switching element 46 as described with reference to FIG. 1 is coupled between the positive high voltage output terminal 44 and earth with the EHT diode 48 reverse biased. During normal spraying operation, the LED 50 is inactive and the diode 48 is effectively non-conducting except for a neglible flow of dark current. When generator 30 is de-energised, the LED 50 is activated temporarily thereby rendering the EHT diode conducting in the reverse direction to provide a path to earth for the residual stored charge.

Activation of the LED 50 is effected automatically in response to release of the trigger by the user. Trigger release is accompanied by movement of the switch 36 from pole 52 to pole 54 thereby coupling resistive divider R1, R2 to the input of the input side of the generator 30. As a result, internal capacitance depicted by reference numeral 56 at the input side of the generator 30 is discharged to earth via the divider R1, R2. This current flow develops a control voltage at the base of transistor switch 58 which is switched to an "on" state to couple the LED 50 to the battery power supply 34 via current limiting resistor 60. In this way, the LED is activated to render the EHT diode 48 conductive to dissipate the residual charge.

The control current derived from the internal capacitance 56 is effective for only a limited time interval governed by the time constant of the resistive/capacitive network formed by the components 56, R1, R2. Once the control current decays, the transistor switch 58 reverts to an "off" condition and LED 50 is de-activated. In practice, the circuit will be designed to ensure sufficient (usually complete) and rapid discharge of the residual charge at the output side of the generator 30 to obviate any risk of electric shock to the operator.

In FIG. 2, only one switching element 46 is shown; however in some cases, especially when the high voltage output of the generator is particularly large, eg 30 kV or more, there may be two switching elements 46 (or even more, although two will suffice for most purposes) arranged with the EHT diodes 48 thereof in series between the output terminal 44 and earth. In this event, the circuit will be modified appropriately to energise both LED's 50.

In FIG. 2, the EHT diode 48 is arranged in reverse-biased relation to the high voltage output applied to the terminal 48. In an alternative arrangement, it can be arranged to provide a dual function, namely discharge of the residual charge when spraying is discontinued and rectification of the output produced at the secondary of the step-up transformer of the generator 30. Referring to FIG. 3, as this embodiment is generally similar to that of FIG. 2 the low voltage circuit 32 is shown in the form of a block but it will be understood that it is in the same form as in FIG. 2; also in FIG. 3 like components are depicted by the same reference numerals as in FIG. 2. The manner of operation of the embodiment of FIG. 3 is generally the same as that of FIG. 2 except in the respects described below. The EHT diode 48 in this case is coupled in forward-biased condition between the secondary winding S of the step-up transformer and the output terminal 44. Capacitor 62 (which may be a discrete circuit component or may be a capacitance presented by the load) serves to eliminate high voltage peaks and provide smoothing as described in relation to FIG. 2. In operation of the generator 30, the secondary output is rectified by the EHT diode 48 to provide a unipolar output to the terminal 44. When spraying is discontinued and the generator 30 de-energised, the LED 50 is temporarily activated in the manner described in relation to FIG. 2 to render the EHT diode 48 conductive in the reverse bias direction thereby providing, via the secondary S, a discharge path to earth for residual charge stored by capacitor 62 and capacitance associated with the load.

Figure 4:
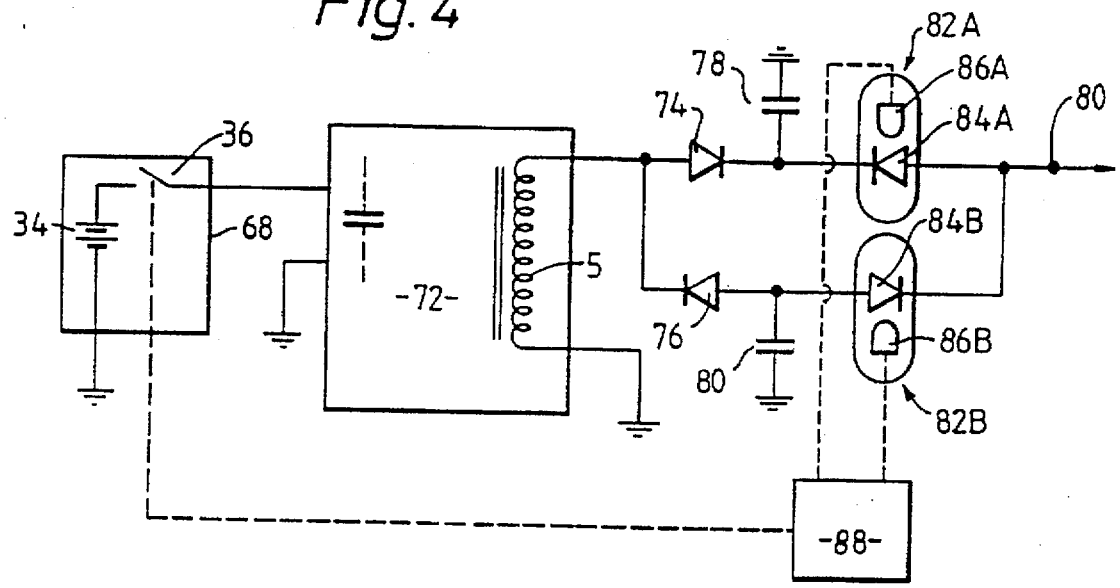
FIG. 4 is a diagrammatic view of circuitry for generating a bipolar high voltage output for use in for example an electrostatic spraying device requiring a bipolar output for shock suppression and/or permitting the spraying of targets which ordinarily are difficult to spray, eg. targets of electrically insulating material.

FIG. 4 illustrates an embodiment employing the switching elements according to the invention for the purpose of producing a bipolar output at the output terminal of the device. A device producing a bipolar output may be used for shock suppression as disclosed in EP-A-468736 or for effecting spraying of targets which are normally difficult to spray electrostatically (eg. targets composed of electrically insulating material), as disclosed in EP-A-468735. The disclosures of EP-A-468735 and 468736 are incorporated herein by reference. The arrangement of FIG. 4 may be embodied in various forms of spraying device of the type referred to above in relation to FIG. 2, eg devices using either passive or forced feed of liquid to the spraying nozzle.

In FIG. 4, the high voltage generator 72 is connected at its low voltage input to a dc battery supply 34 and a user-actuated switch 36 forming part of a low voltage circuit 68. The high voltage side of the secondary winding S of the step-up transformer incorporated in the high voltage generator 72 produces a high voltage in the form of an alternating pulse train (typically having a frequency of the order of 20 Hz) which is coupled to a pair of conventional high voltage diodes 74, 76 arranged in parallel but biased oppositely. The alternating EMF induced in the secondary winding S is therefore rectified, diode 74 passing the positive going cycles of the voltage and diode 76 passing the negative going cycles. Capacitors 78, 80 are associated one with each diode 74, 76 to eliminate voltage peaks and provide smoothing of the pulses. Switching elements 82A, B control coupling of the generator voltage to the output terminal 80 which in turn is coupled to the nozzle in any suitable fashion to apply high voltage to the liquid emerging at the nozzle outlet. Each switching element 82A, B comprises a high voltage diode 84A, B and associated LED 86A, B and is arranged to function in the manner previously described with reference to FIG. 1 to 3.

Each diode 84A, B is connected in series and in back-to-back relation with a respective one of the conventional diodes 74, 76. Activation of the LED's 86A, B is controlled by control circuit 88 in such a way that the diodes 84A, B are alternately and cyclically rendered conductive in the reverse bias direction, control circuit 88 being activated in response to closure of user-actuated switch 36 (eg actuated in response to squeezing of a trigger associated with a hand grip portion of the device). Control circuit 88 is designed so that diodes 84A, B are rendered conductive alternately with a frequency appropriate to the effect to be achieved by means of the bipolar output, eg shock suppression or spraying of insulating targets as disclosed in EP-A-468736 and 468735. Thus, for example, the control circuit 88 my be operable to control conduction of the diodes 84A and 84B in such a way as to produce a bipolar output at terminal 80 of generally square wave form with a frequency of the order of up to 10 Hz, typically 1 to 2 Hz.

It will be understood that the circuits shown diagramatically in FIGS. 2 to 4 and the liquid supply will, in practice, be embodied in a common housing so that the device is self-contained and portable.

Figure 5:
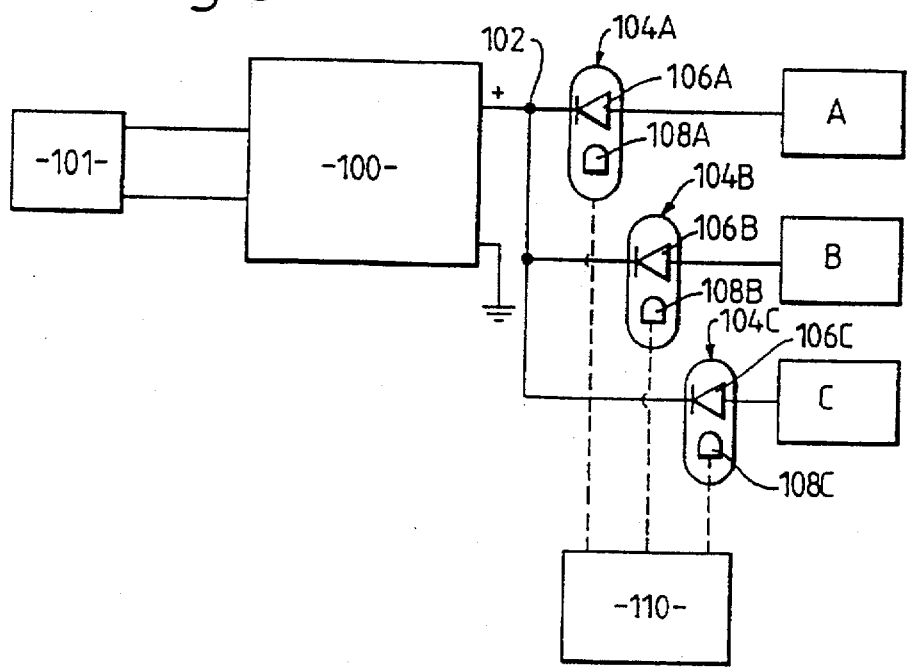
FIG. 5 is a schematic view of circuitry for providing a high voltage output and selectively routing the output to a number of output devices.

Referring now to FIG. 5, in this embodiment high voltage generator 100 has its input side connected to low voltage dc supply circuit 101 and its output is intended to be coupled selectively to one or more of a number of devices requiring a high output voltage. Thus, in FIG. 5 the generator 100 produces at the output terminal 102 thereof a unipolar voltage for application to three output devices A, B and C which are connected to the output terminal 102 via switching elements 104A, B and C each of which comprises a high voltage diode 106A, B, C and LED's 108A, B, C and is arranged to operate in the manner described hereinabove. The diodes 106A, B, C are configured in reverse biased relation to the output voltage generated by generator 100. The switching devices are controlled by control circuit 110 which may be programmed or selectively operable to supply current to any one or more of the LED's in order to render the associated diode conducting in the reverse direction thereby permitting the application of the voltage output of the generator to the respective output device(s). In this way, the output devices A, B and C can be operated in a pre-programmed sequence or any desired manner. For instance, the control circuit 110 may be associated with a number of user-operable switches or other means whereby the user may select which of the output devices (such as electrostatic spraying nozzles as described herein) is to be operated. In response to selection of a particular device by the user, the control circuit 110 may then activate the appropriate LED to permit supply of the high voltage output from the generator to that device.

Figure 6:
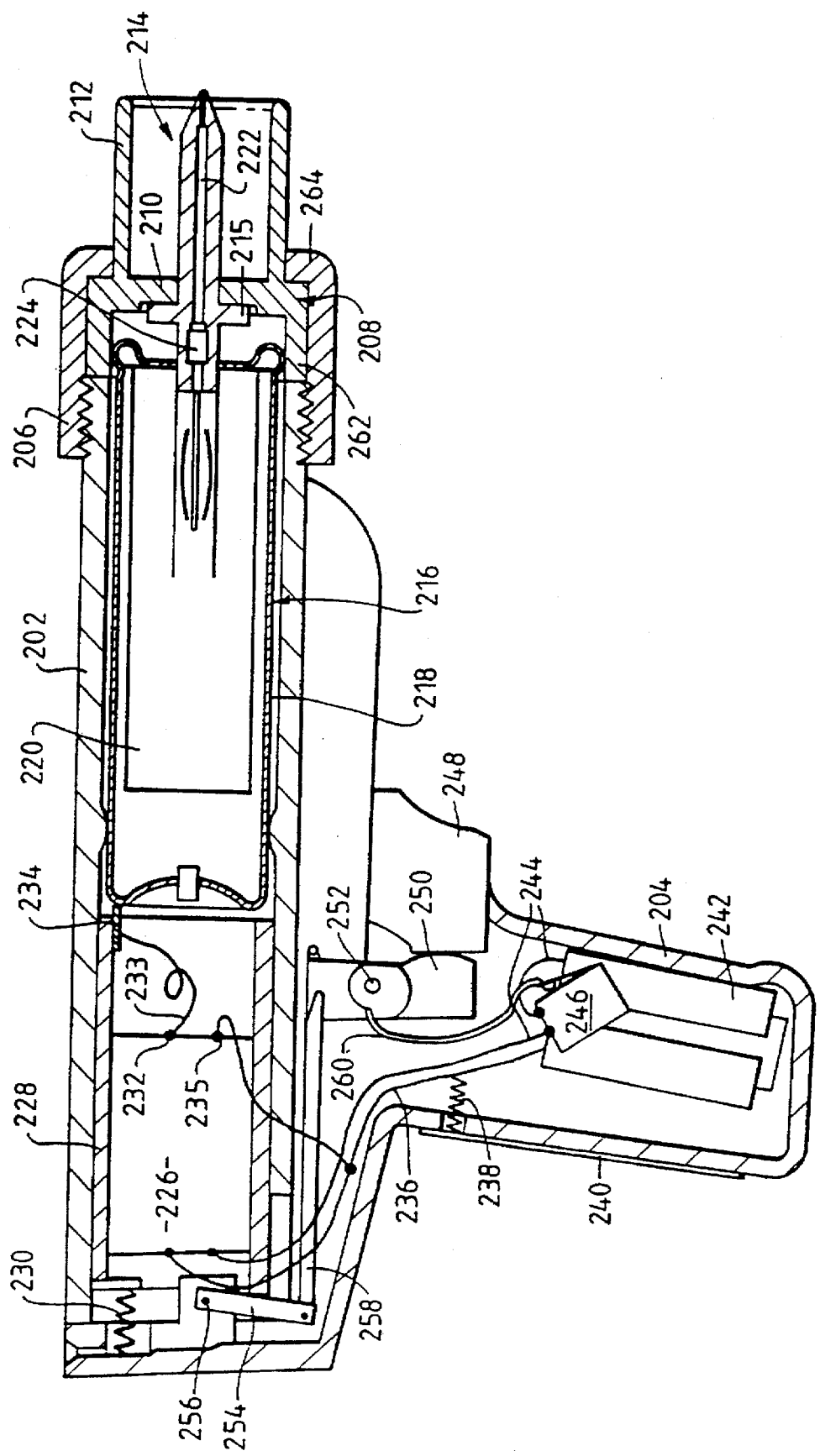
FIG. 6 is a schematic view of one form of spray gun to which the arrangement of FIG. 2 or 3 may be applied.

Referring now to FIG. 6, the spray gun illustrated is intended for hand-held use and is suitable for use in spraying relatively viscous, low resistivity liquid formulations such as paints, at flow rates of up to at least 4 cc/min. A typical formulation to be sprayed has a viscosity of the order of 1 Poise and a resistivity of the order of $5 \times 10^6$ ohm.cm. The spray gun comprises a body member 202 and a hand grip 204. The body member 202 is in the form of a tube of insulating plastics material, eg a highly insulating material such as polypropylene. At the end remote from the hand grip 204, the body member is provided with a collar 206 which is also composed of a highly insulating material such as polypropylene and which is screwthreadedly or otherwise releasably engaged with the body member 202 for quick release and access to the liquid container. The collar 206 secures a component 208 in position at the end of the body member 202, the component 208 comprising a base 210 and an integral annular shroud 212 which projects forwardly of the gun.

The base 210 has a central aperture through which a nozzle 214 projects, the rear end of the nozzle 214 being formed with flange 215 which seats against the rear face of the base 210. The nozzle 214 is composed of a highly insulating material, such as a polyacetal (eg "Delrin"), typically with s bulk resistivity of the order of $10^{15}$ ohm.cm. The body member 202 receives a replaceable cartridge 216 for delivering liquid to be sprayed to the nozzle 214. As the gun is required to deliver liquid at a flow rate of up to at least 4 cc/min, a positive feed of liquid to the nozzle 214 is needed and in this embodiment of the invention is effected by the use a cartridge in the form of a so-called barrier pack comprising a metal container 218 pressurised by a liquefied propellant, eg fluorocarbon 134A, and the liquid to be sprayed is enclosed within a flexible metal foil sack 220 which separates the liquid from the propellant. The interior of the sack 220 communicates with an axial passage 222 within the nozzle via a valve 224 which operates in a similar manner to the valve of a conventional aerosol-type can in that displacement of the valve in the rearward direction relative to the container 218 opens the valve 224 to permit positive liquid flow into the passage 222 (by virtue of the pressurisation produced by the propellant). The passage 222 terminates at its forward end in a reduced diameter bore forming the outlet of the nozzle. The forward extremity of the nozzle 214 terminates close to or at a plane containing the forward extremity of the shroud 212.

Rearwardly of the cartridge 216, the body member 202 accommodates a high voltage generator 226 which is mounted in a tubular carrier 228. The carrier 228 is mounted for limited sliding movement axially of the body member 202. A tension spring 230 biases the carrier 228 rearwardly. The high voltage generator 226 is of the type which produces a pulsed output and then rectifies and smooths it to provide a high voltage DC output. A suitable form of generator 226 of this type is described in European Patent Application No. 163390. The generator has a high voltage output pole 232 connected by lead 233 to a contact 234 secured to the carrier and arranged for engagement with the rear end of the metal container 218. A second output pole 235 of the generator is arranged to be connected to earth via lead 236, resistor 238 and a conductive contact strip 240 secured to the exterior surface of the hand grip 204 so that, when the gun is held by the user, a path to earth is provided through the user. The generator is powered by a low voltage DC supply comprising battery pack 242 accommodated within the handgrip 204 and forming part of a low voltage circuit including lead 236 coupled to earth (via the resistor 238 and the user) and a lead 244 connecting the battery pack 242 to the input side of the generator 226 via a microswitch 246.

The valve 224 is opened, in use, by relative movement between the cartridge 216 and the body member 202, the nozzle 214 remaining fixed relative to the body member. Movement to operate the valve 224 is applied to the cartridge 216 by movement of the generator/carrier assembly, the latter being moved by operation of a trigger 248 associated with the handgrip 204 and which, when squeezed, pivots lever 250 about its pivotal connection 252 thereby pivoting a further lever 254 which is pivoted at 256 and is coupled to lever 250 by link 258. The lever 254 bears against the rear end of the carrier 228 so that pivoting of the lever 254 is effective to displace the carrier and hence the cartridge 216 forwardly thereby opening the valve 224. Upon release of the trigger 248, the various components are restored to their starting positions as shown in FIG. 6 by suitable biasing means including spring 230. Squeezing of the trigger 248 is also accompanied by movement of a linkage 260 which is coupled to the microswitch 246 so that trigger operation is accompanied by microswitch operation to supply low voltage power to the generator 226.

The high voltage produced by the generator, typically in excess of 25 kV for a device designed to spray relatively viscous, low resistivity liquids at flow rates of up to at least 4 cc/min (eg up to 6 cc/min or even more), is coupled to the outlet of the nozzle 214 via contact 234, the metal container 218 and the liquid within the passage 222 to provide an electric field between the nozzle tip and the surroundings at earth potential. This electric field is established with the aim of drawing the liquid emerging at the nozzle outlet into a ligament which will break up into a divergent spray of relatively uniformly-sized, electrically charmed droplets suitable for deposition as a uniform film. Because of the relatively viscous nature of the formulation to be sprayed (eg of the order of 1 Poise), the diameter of the outlet has to be made relatively large (typically at least 600 microns) in order to achieve flow rates up to at least 4 cc/min. Also, with relatively viscous materials, to achieve satisfactory ligament formation (especially single, axially directed ligament formation) at flow rates of this order, it is necessary to operate at higher voltages than are necessary for lower viscosity liquids since ligament formation from viscous materials requires increased electric field intensity.

For this reason, the generator 226 employed in the spray gun of FIG. 6 has an output voltage of 25 kV or greater as measured by connecting the high voltage output of the generator to a Brandenburg 139D high voltage meter having an internal resistance of 30 Gigohm. However, the use of voltages of this order would normally lead to spurious spraying probably as a result of corona discharge effects since the field intensity in the immediate vicinity of the nozzle outlet may exceed the breakdown potential of air. Such spurious spraying may for instance result in highly polydisperse droplets in the form of a mist of very fine droplets splitting off from the ligament and poorly divergent, paraxial streams of coarse droplets.

Satisfactory ligament formation and break up in the presence of voltages of 25 kV or greater is achieved in the gun of FIG. 6 by provision of the component 208 and in particular the annular shroud portion 212. The component 208 is composed of a semi-insulating material (typically with a bulk resistivity up to $10^{11}$–$10^{12}$ ohm.cm), eg "Hytrel" grade 4778 available from DuPont Corporation, and is arranged with a rearwardly projecting annular portion 262 thereof in contact with the metal container 218 so that the voltage applied via the contact 234 is established at the forward extremity of the shroud 212 and is of the same polarity as, and of substantially the same magnitude as, the voltage produced at the outlet of the nozzle 214. The annular portion 262 is trapped between the forward end of the body member 202 and a flange 264 on collar 206 so that component 208 is fixed relative to the body member 202. Operation of the trigger 248 leads to displacement of the container 218 relative to the component 208 but electrical continuity is maintained by sliding contact between the leading end of the container 218 and the inner periphery of the annular portion 262.

It will be understood that contact between the high voltage generator and the shroud may be effected in ways other than the sliding contact arrangement shown; for instance the contact may be made through a spring contact. Usually the contact arrangement will be such as to ensure that a voltage substantially corresponding to that established at the nozzle tip is developed on the shroud in advance of, or substantially simultaneously, with the commencement of spraying so that the shroud is immediately effective on commencement of spraying.

By appropriate location of the forward extremity of the shroud relative to the tip of the nozzle, the field intensity in the immediate vicinity of the nozzle tip can be attenuated sufficiently to produce formation of a single ligament which breaks up into relatively uniform-sized droplets. The optimum position of the shroud extremity can be readily established by trial and error, ie by means of a prototype version of the gun having an axially adjustable shroud. In this way, the shroud can be adjusted forwardly from a retracted position while observing the nature of the spray. Initially, with the shroud retracted, the spurious spraying effects referred to above are observed and as the shroud is moved forwardly a position is reached where the spray quality improves markedly and relatively uniform-sized droplets are obtained. Adjustment beyond this point does not affect the quality of spraying initially but tends to have a focusing effect. In practice, where the voltage established on the shroud extremity is of substantially the same magnitude as that on the nozzle tip, we have found that the optimum position tends be one in which the tip of the nozzle more or less coincides with a plane containing the forward extremity of the shroud; in a typical arrangement, using a shroud having an internal diameter of 16 mm and an external diameter of 20 mm, the nozzle tip projects about 1 mm beyond this plane. Usually the arrangement will be such that the angle between imaginary lines extending between the forward extremity of the nozzle and diametrically opposite forward extremities of the shroud is in the range 140° to 195°, more preferably 150° to 180° (angles less than 180° corresponding to the nozzle forward extremity being forward of the shroud and angles greater than 180° corresponding to the shroud being forward of the nozzle forward extremity).

The marked difference in the nature of ligament break up can be demonstrated by operating two nozzles under identical conditions with the same liquid, one nozzle being operated without a shroud and the other with a shroud located at an optimum position. A typical break up regime in the case where no shroud is present involves the production of a mist of very fine droplets a short distance from the nozzle outlet followed by break up of the central core of the ligament into streams of poorly divergent coarse droplets. The spray produced in this instance is wholly unsuitable for the production of a uniform film of the liquid (eg paint) on a surface to be sprayed. In contrast, with a shroud located in an optimum position and operating at substantially the same voltage as that prevailing at the nozzle tip, the ligament was observed to travel a substantial distance from the outlet of the nozzle before breaking up into divergent streams of droplets having a narrow size distribution. The production of a spray with droplets having a volume median diameter of less than 100 microns was readily achievable when the nozzle was operated with the shroud in an optimum position.

The presence of the metal container 218, coupled with the relatively high voltage applied at the tip of the nozzle (ie usually greater than 25 kV), can lead to a large build up of capacitively stored charge during spraying with the possibility of the user experiencing an unpleasant electric shock if the user attempts to access the interior of the device on cessation of spraying, eg for the purpose of replacing the cartridge. This possibility is obviated by the incorporation of means for discharging the capacitively stored charge in response to cessation of spraying, such means conveniently being arranged in the manner described in the embodiment of FIG. 2 or 3.

The spray gun of FIG. 6 is particularly suitable for spraying liquids having viscosities between 0.5 and 10 Poise (especially 1 to 8 Poise) and resistivities between $5 \times 10^5$ and $5 \times 10^7$ ohm.cm (especially between $2 \times 10^6$ and $1 \times 10^7$ ohm.cm) at spraying/flow rates of up to at least 4 cc/min and more preferably up to 6 cc/min. The diameter of the nozzle outlet and the voltage output of the voltage generator 226 are selected according to the viscosity and resistivity of the liquid to be sprayed. Typically the nozzle outlet will have a diameter of at least 600 microns in order to avoid blockage by any particles suspended in the relatively viscous liquid (eg. as in the case of a paint formulation) and to achieve the desired spraying/flow rates without requiring undue application of force to the trigger. The DC output voltage of the generator 226 will typically be between 25 and 40 kV, more usually between 28 and 35 kV, as measured by a Brandenburg 139D high voltage meter having an internal resistance of 30 Gigohm. Although it is simpler to connect the shroud 212 directly to the output of the generator 226 so that the voltage established on the shroud is of substantially the same magnitude as that prevailing at the tip of the nozzle, we do not exclude the possibility of the shroud voltage being significantly different from that of the nozzle tip; in this event, the difference in voltages can be compensated for by appropriate positioning of the shroud relative to the nozzle tip so as to secure the desired divergent spray of droplets having a narrow size distribution.

It will be understood that the spraying device described with reference to FIG. 6 may be additionally or alternatively modified by incorporating electronic switching for other purposes described herein, eg modification in accordance with the embodiment of FIG. 4.

We claim:

1. An electrostatic spraying device comprising a housing nozzle means, means for supplying to the nozzle means material to be sprayed, and high voltage generating circuitry having an output terminal via which high voltage is applied to said material to effect electrostatic spraying thereof, said circuitry including radiation sensitive electronic switching means and radiation producing means to irradiate the switching means, the switching means being reverse biased by the high voltage during spraying operation of the device and the arrangement being such that, in response to de-energisation of the circuitry, the radiation producing means is operated to irradiate the switching means and thereby render the latter conducting so as to provide a path for discharge of current from any capacitively stored electrical charge at the high voltage output side of the circuitry.

2. A device as claimed in claim 1 in which the switching means is rendered conductive automatically in response to operation of a user-actuable switch for de-energising the high voltage circuitry and discontinuing spraying.

3. A device as claimed in claim 1 in which the high voltage circuitry includes a step-up transformer with one side of the secondary thereof tapped to provide an alternating high voltage output and the other side of the secondary connected to a low potential.

4. An electrostatic spraying device comprising a housing, nozzle means, means for supplying to the nozzle means material to be sprayed, high voltage generating circuitry having an output terminal via which high voltage is applied to said material to effect electrostatic spraying thereof, an annular element encircling the nozzle means and on which a high voltage of the same polarity as that applied to said material is established during spraying to modify the field intensity in the immediate vicinity of the nozzle outlet, and means operable upon cessation of spraying to discharge electrical charge stored by capacitive elements of the device during spraying, said discharge means comprising electronic switching means, said electronic switching means comprising a radiation-sensitive electronic switch and radiation-producing means for controlling operation of the electronic switch.

5. A device as claimed in claim 4 including user-operable means for controlling activation and deactivation of the high voltage circuitry and in which said discharge means is operable automatically in response to deactivation of the high voltage circuitry.

6. A device as claimed in claim 4 in which the annular element is connected to said high voltage circuitry in order to establish said high voltage on the annular element during spraying.

7. A device as claimed in claim 6 in which the voltage established on the annular element is of the same polarity as and of substantially the same magnitude as the voltage applied to the material emerging at the outlet of the nozzle means.

8. A device as claimed in claim 4 in which the voltage produced by said high voltage circuitry for application to the material to be sprayed and to the annular element in excess of 25 kV.

9. An electrostatic spraying device comprising a housing, nozzle means, means for supplying to the nozzle means material to be sprayed, and high voltage generating circuitry producing an alternating output voltage which is coupled through a rectifier to an output terminal whereby a rectified high voltage is applied to said material to effect electrostatic spraying thereof, said rectifier being constituted by a radiation sensitive high voltage diode and an associated radiation producing means operable to irradiate the diode in response to de-energisation of the voltage generating circuitry and render the diode conducting in the reverse bias direction to provide a path for discharge of current from any capacitively stored electrical charge at the high voltage output side of the device.

10. A device as claimed in claim 9 in which the high voltage circuitry includes a step-up transformer with one side of the secondary thereof tapped to provide said alternating output voltage and the other side of the secondary connected to a low potential, and in which said high voltage diode is connected in series with the secondary to rectify the alternating output voltage.

11. An electrostatic spraying device comprising a housing, nozzle means, means for supplying to the nozzle means a material to he sprayed, and high voltage generating circuitry having an output terminal through which high voltage is applied to the material whereby the sprayed material is electrostatically charged, said circuitry including a generator producing at an intermediate output of said circuitry an alternating high voltage, first and second rectifier means arranged in parallel, oppositely poled relation and coupling oppositely going high voltage output components said intermediate generator output to said output terminal through respective first and second radiation sensitive electronic high voltage diodes which are reverse biased relative to the respective first and second rectifier means, and radiation producing control means for irradiating each said first and second high voltage diode to render the same conducting when reverse biased by the voltage output component conducted by the respective first and second rectifier means, said control means rendering the high voltage diodes so conducting in alternate fashion whereby said voltage output components are coupled to the nozzle means at a frequency lower than the alternating frequency of the voltage produced at said intermediate output.

12. A device as claimed in claim 11 in which each of said first and second high voltage diodes comprises a series of radiation sensitive semiconductor junctions collectively having a maximum dc reverse voltage of at least 1 kV and terminal means for the application of high voltage to the junctions such that the junctions permit current flow in one direction only when forwardly biased by an applied voltage, and in which the radiation producing control means comprises a radiation source associated with each of said first and second diodes for selectively irradiating said junctions so as to produce current flow in the reverse direction when the junctions are reverse biased by the applied voltage, said junctions and each radiation source being supported in fixed predetermined relation and encapsulated in a common mass of encapsulating material.

13. A device as claimed in claim 12 in which the encapsulating mass provides or incorporates a reflective surface or surfaces in the vicinity of the junctions.

14. A device as claimed in any one of claims 10, 2, 4, 6, 7, 8, 9, 10, 3, 11, 12, and 13 in which the high voltage is applied to the nozzle means through the agency of the material to be sprayed.

15. A device as claimed in any one of claims 1, 2, 4, 5, 6 and 7 in which the electronic switching means comprises a series of radiation sensitive semiconductor junctions collectively having a maximum dc reverse voltage of at least 1 kV and terminal means for the application of high voltage to the junctions such that the junctions permit current flow in one direction only when forwardly biased by an applied voltage, and in which the radiation producing means comprises a radiation source for selectively irradiating said junctions so as to produce current flow in the reverse direction when the junctions are reverse biased by the applied voltage, said junctions and the radiation source being supported in fixed predetermined relation and encapsulated in a common mass of encapsulating material.

16. A device as claimed in claim 15 in which the encapsulating mass provides or incorporates a reflective surface or surfaces in the vicinity of the junctions.

17. A device as claimed in any one of claims 11 to 13 in which the generator includes a step-up transformer with one side of the secondary thereof tapped to supply said alternating high voltage output to said intermediate output and the other side of the secondary connected to a low potential.

* * * * *